United States Patent
Shastri et al.

(10) Patent No.: US 7,579,670 B2
(45) Date of Patent: *Aug. 25, 2009

(54) INTEGRATED FILTER HAVING GROUND PLANE STRUCTURE

(75) Inventors: Sudhama C. Shastri, Phoenix, AZ (US); Yenting Wen, Chandler, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 414 days.

This patent is subject to a terminal disclaimer.

(21) Appl. No.: 11/482,238

(22) Filed: Jul. 3, 2006

(65) Prior Publication Data

US 2008/0001186 A1    Jan. 3, 2008

(51) Int. Cl.
    *H01L 29/00* (2006.01)
(52) U.S. Cl. .................................. 257/531; 257/532
(58) Field of Classification Search ............... 257/531, 257/532
    See application file for complete search history.

(56) References Cited

U.S. PATENT DOCUMENTS

| | | | |
|---|---|---|---|
| 3,671,793 A | 6/1972 | Scarlett | |
| 4,157,517 A | 6/1979 | Kneisel et al. | |
| 4,211,941 A | 7/1980 | Schade, Jr. | |
| 4,633,291 A | 12/1986 | Koyama | |
| 4,682,129 A | 7/1987 | Bakermans et al. | |
| 5,018,000 A | 5/1991 | Yamada et al. | |
| 5,019,000 A | 5/1991 | Stephens | |
| 5,939,958 A * | 8/1999 | Grounds et al. | 333/204 |
| 6,362,012 B1 | 3/2002 | Chi | |
| 6,538,300 B1 | 3/2003 | Goldberger et al. | |
| 6,943,737 B2 | 9/2005 | Ryken et al. | |
| 7,199,679 B2 * | 4/2007 | Mondal | 333/25 |
| 7,466,212 B2 * | 12/2008 | Shastri et al. | 333/186 |
| 2006/0091970 A1 | 5/2006 | Mondal | |
| 2007/0290297 A1 * | 12/2007 | Shastri et al. | 257/531 |

OTHER PUBLICATIONS

"Filters and Components with Inductance Cancellation", Timothy C. Neugebauer et al, published Aug. 13, 2002, 9 pgs.
"Analog Circuit Noise Sources and Remedies", Bonnie C. Baker, Published May 15, 2004, ECN (ecnmag.com article CA418799), 5 pgs.
ISSCC 2002Session 14/Cellular rf Wireless/14.1, "14.1 A Dual-Band Direct-Conversion/VLIF Transceiver for 50GSM/GS/DCS/PCS", Stephen Dow et al.,2002 IEEE International Solid-State Circuits Conference 0-7803-7335-9, Feb. 5, 2002, 3 pgs.
"Design automation methodology and rf/analog modeling for rf CMOS and SiGe BiCMOS technologies", D. L. Harame et al., IBM J. Res. & Dev., vol. 47, No. 2/3, Mar./May 2003, pp. 139-163.
USPTO Office Action for Case U.S. Appl. No. 11/454,387, by Sudhama Shastri et al; Mailed Apr. 16, 2008.
USPTO Office Action for Case U.S. Appl. No. 11/454,682, by Sudhama Shastri et al; Mailed Jun. 17, 2008.

* cited by examiner

*Primary Examiner*—Howard Weiss
(74) *Attorney, Agent, or Firm*—Kevin B. Jackson

(57) ABSTRACT

In one embodiment, a filter structure includes first and second filter devices formed using a semiconductor substrate. A vertical ground plane structure prevents cross-coupling between the first and second filter devices.

19 Claims, 10 Drawing Sheets

INTEGRATED FILTER HAVING GROUND PLANE STRUCTURE

FIELD OF THE INVENTION

This invention relates generally to electronic devices, and more specifically to semiconductor device structures and methods of their manufacture.

BACKGROUND OF THE INVENTION

Electronic filters are used today to suppress noise, reject unwanted signals, or in some way manipulate the characteristics of an input signal. Typical semiconductor based filter designs comprise inductor, resistor and/or capacitor networks. Such networks are often placed together with separate transient voltage suppression (TVS) devices such as Zener diodes to provide ESD protection in addition to signal processing. The capacitance contribution of the TVS device often is used to further shape the filter characteristic.

One challenge semiconductor based filter designers face is providing an effective design in as small a space as possible in order to meet the size requirements that some applications demand. This challenge is often difficult, particularly when the filter design includes multiple channels and inductor structures. Specifically, the presence of inductor structures increases the likelihood of inter-channel coupling, which is an undesired effect.

Accordingly, a structure and method of manufacture are needed that, among other things, reduce inter-channel coupling effects in integrated filter designs.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-channel devices, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles.

Moreover, although the present invention is described using an elliptic filter embodiment, it is understood that this is for illustrative purposes only, and that the present invention is suitable for other filter or resonant structures as well including but not limited to pi-RC filters, pi-LC filters, Chebyshev filters or Butterworth filters. Additionally, the present invention is suitable for those filters that include active components.

DETAILED DESCRIPTION OF THE DRAWINGS

Figure 1:
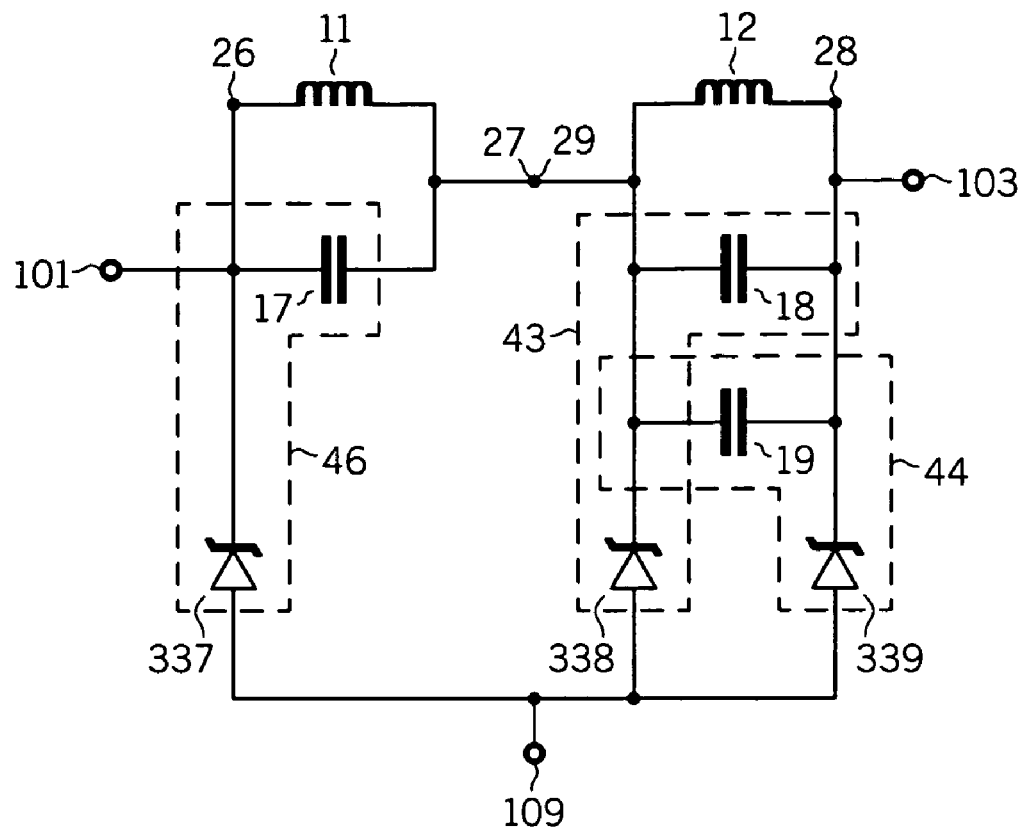
FIG. 1 illustrates a schematic of a filter circuit for use with an embodiment of the present invention.

FIG. 1 schematically illustrates an embodiment of a filter circuit or structure 15 for use with the present invention. Structure 15 includes an input 101 and an output 103, and further includes an inductor 11 coupled in parallel with a floating capacitor 17 to form a first resonant circuit. Inductor 11 includes an input terminal 26 and output terminal 27. Structure 15 further includes an inductor 12 in parallel with floating capacitors 18 and 19. Inductor 12 includes an input terminal 29, which is a common connection with output terminal 27, and an output terminal 28. A first TVS device 337 is connected between input terminal 26 and a common return terminal 109. A second TVS device 338 is connected between input terminal 29 and common return terminal 109, and a third TVS device 339 is connected between output terminal 28 and common return terminal 109.

Floating capacitor 17 comprises, for example, a first MOS capacitor, and is combined or integrated with TVS device 337 into a single device or device 46. Floating capacitor 18 comprises, for example, a second MOS capacitor, and is combined or integrated with TVS device 338 into a single device or device 43. Floating capacitor 19 comprises, for example, a third MOS capacitor, and is combined or integrated with TVS device 339 into a single device or device 44. The capacitances of these devices are adjusted according to the output requirements or specifications of filter or structure 15.

Figure 2:
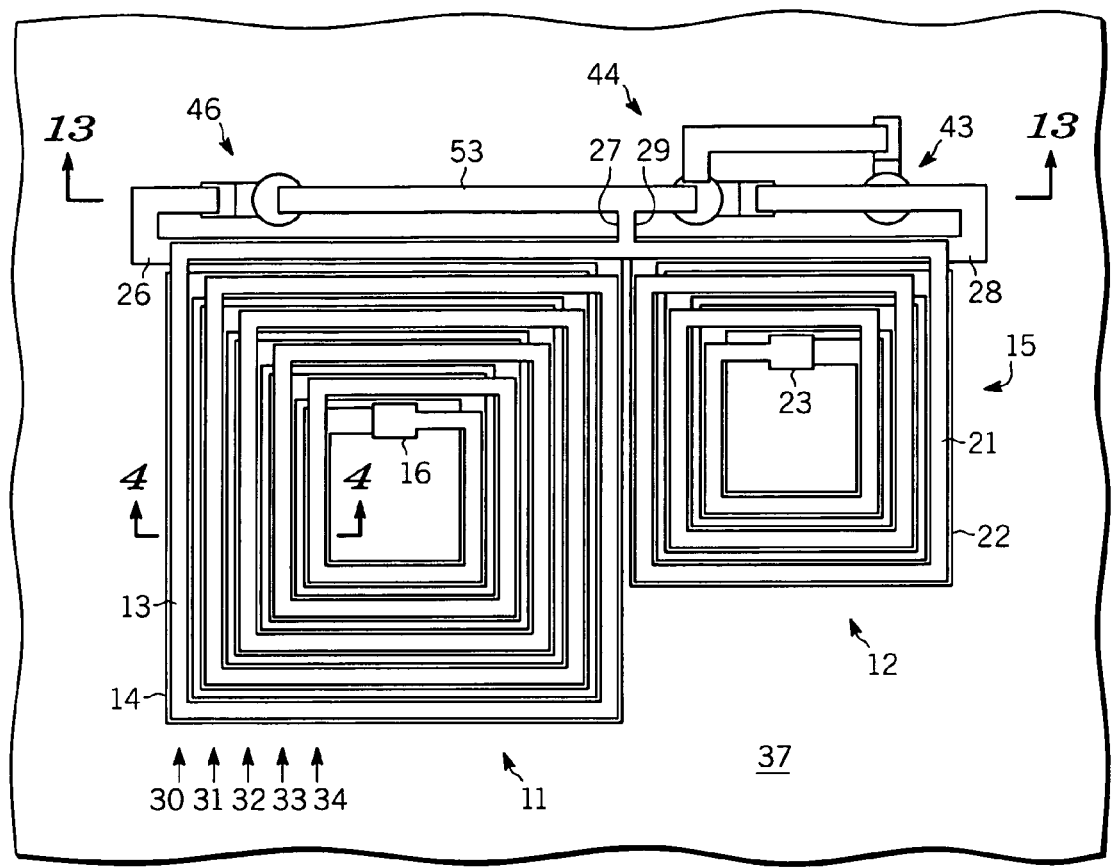
FIG. 2 illustrates a plan view of a portion of a structure including an implementation of the filter circuit of FIG. 2.
Figure 3:
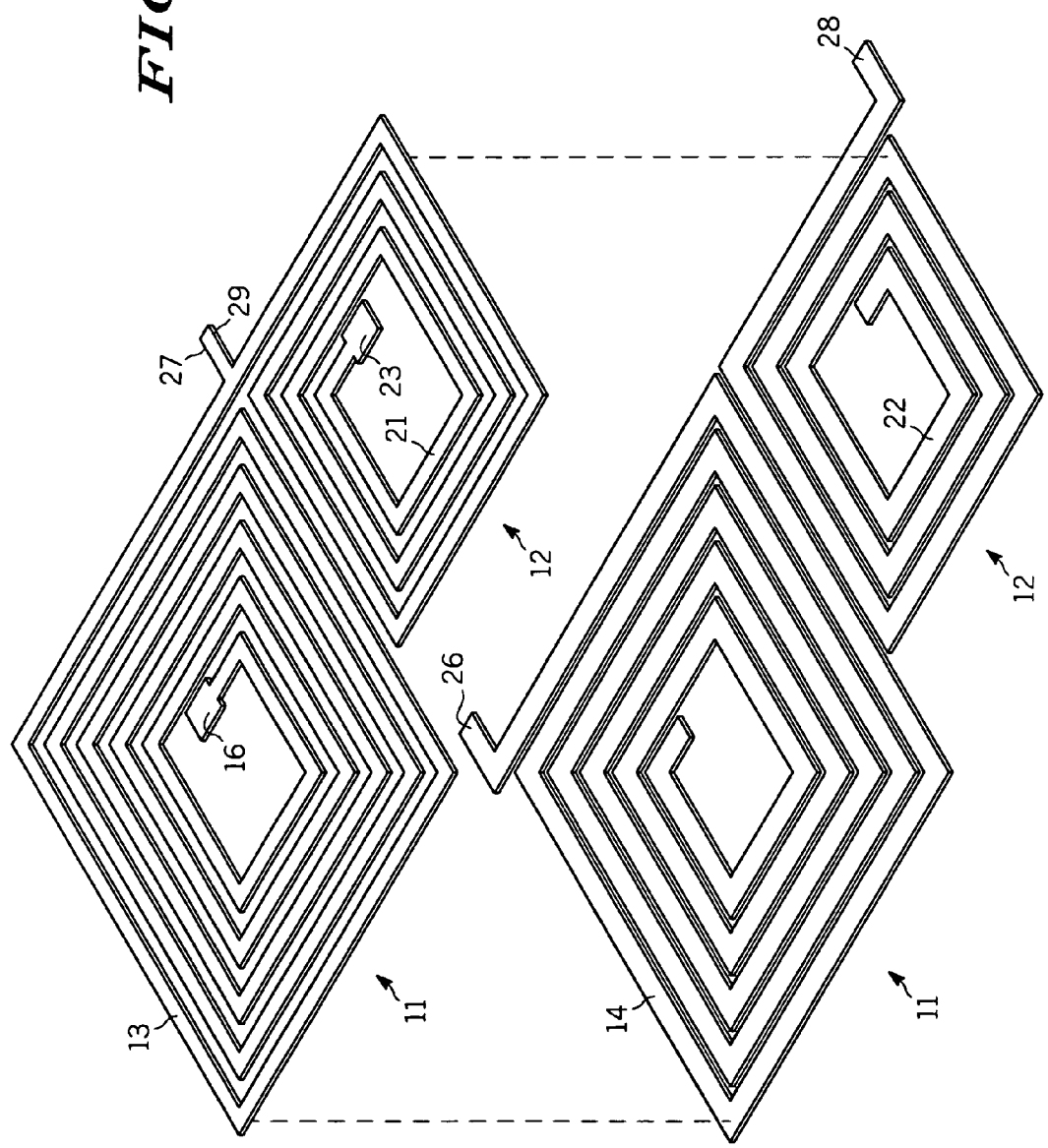
FIG. 3 illustrates an exploded view of a portion of the device of FIG. 2.
Figure 4:
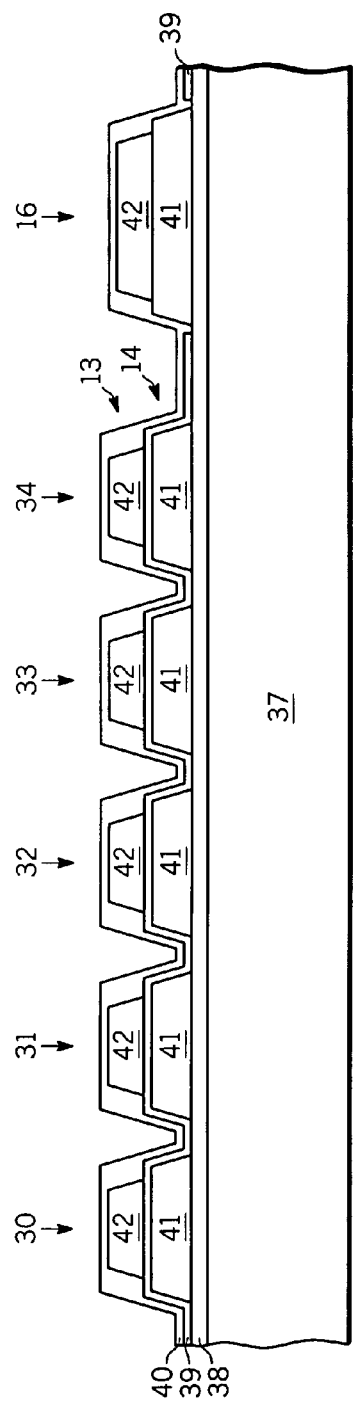
FIG. 4 illustrates a cross-sectional view of a portion of the device of FIG. 2 taken along reference line 4-4.

The following description has reference to FIG. 2, FIG. 3 and FIG. 4. FIG. 2 illustrates an enlarged plan view of a portion of an embodiment of a semiconductor filter device 10 that includes filter structure 15 of FIG. 1. Structure 15 is identified in a general manner by an arrow. Devices 43, 44, and 46 are shown connected to inductors 11 and 12. In this embodiment, inductors 11 and 12 comprise stacked or multi-layer structures. As will be understood by those skilled in the art, integrated semiconductor inductors such as inductor 11 or inductor 12 or the combination thereof may be used to form several types of filters including Bessel, band pass, Chebyschev, and/or elliptic filters. FIG. 3 illustrates an enlarged exploded view of a portion of inductor structures 11 and 12 of FIG. 3. FIG. 4 illustrates, in a general way, an enlarged cross-sectional view of a portion of first stacked inductor 11 taken along reference line 4-4 of FIG. 2. The cross-section of FIG. 4 is illustrated to cut through legs 30, 31, 32, 33, and 34 of inductor 11 shown in FIG. 2.

Inductor 11 is formed to include a first inductor element 14 and a second inductor element 13. First inductor element 14 is formed to overlie a first portion of a surface of substrate 37 and second inductor element 13 is formed overlying element 14. Element 14 is formed in a pattern that provides electro-magnetic coupling between adjacent portions of element 14 in order to provide element 14 an inductance that is greater than the inductance of a straight line conductor. Element 13 is formed in a similar pattern overlying element 14 such that the pattern of element 13 provides electromagnetic coupling between adjacent portions of element 13 in order to provide element 13 an inductance that is greater than the inductance of a straight line conductor. Further, elements 13 and 14 are magnetically coupled to each other.

Additionally the pattern and the overlying proximity of elements 14 and 13 provide electromagnetic coupling between elements 13 and 14 such that elements 13 and 14 form an inductance for inductor 11 that is greater than the sum of the separate inductance of element 13 plus the separate inductance of element 14. Typically, adjacent portions of element 14 are about one to six (1-6) microns apart and adjacent portions of element 13 are about one to ten (1-10) microns apart. Element 13 typically is about one-half to two (0.5-2) microns from element 14 in order to ensure that there is sufficient coupling therebetween. One end or terminal of element 13 is electrically connected to one end or terminal of element 14 at a node 16 in order to provide an electrical connection between elements 13 and 14. A second terminal of element 14 functions as terminal 26 of inductor 11 and a second terminal of element 13 functions as terminal 27 of inductor 11.

Inductor 12 is formed to include a first inductor element 22 and a second inductor element 21. First inductor element 22 is formed to overlie a second portion of the surface of substrate 37 and second inductor element 21 is formed overlying element 22. Element 22 is formed in a pattern that provides electro-magnetic coupling between adjacent portions of element 22 in order to provide element 22 an inductance that is greater than the inductance of a straight line conductor. Element 21 is formed in a similar pattern overlying element 22 such that the pattern of element 21 provides electro-magnetic coupling between adjacent portions of element 21 in order to provide element 21 an inductance that is greater than the inductance of a straight line conductor. Additionally the pattern and the overlying proximity of elements 22 and 21 provide electro-magnetic coupling between elements 22 and 21 such that elements 22 and 21 form an inductance for inductor 12 that is greater than the sum of the separate inductance of element 21 plus the separate inductance of element 22. One end or terminal of element 21 is electrically connected to one end or terminal of element 22 at a node 23 in order to provide an electrical connection between elements 22 and 21. A second terminal of element 22 functions as terminal 28 of inductor 12 and a second terminal of element 22 functions as terminal 29 of inductor 12.

In one embodiment, elements 13 and 14 are formed in the shape of a square spiral. However, each of elements 13 and 14 may be formed in other shapes that provide mutual magnetic flux coupling between adjacent portions of element 13 and that provides mutual flux coupling between adjacent portions of element 14, and between elements 13 and 14. For example, elements 13 and 14 may be formed in a circular spiral, or an elongated spiral, or any well known shapes that provide magnetic flux coupling. In this preferred embodiment, element 14 begins at node 26 and extends in a clockwise direction above the surface of substrate 37 until terminating in terminal 16. Element 13 begins at node 16 and extends in a clockwise direction overlying portions of element 14 that have substantially the same radius as the corresponding portion of element 13 until terminating at terminal 27. Inductor 12 is formed similarly to inductor 11. Element 22 begins at node 23 and extends in a clockwise direction above the surface of substrate 37 until terminating at terminal 28. Element 21 begins at node 29 and extends in a clockwise direction overlying similar portions of element 22 until terminating at terminal 23. The exploded view in FIG. 3 assists in illustrating the overlying relationships between elements 13 and 14 and elements 21 and 22.

Referring to FIG. 2 and FIG. 4, element 14 typically includes a conductor 41 and an overlying dielectric 39. Element 13 typically includes a conductor 42 and an overlying dielectric 40. Typically, conductors 41 and 42 are formed from low resistance conductor materials such as metals in order to minimize the series resistance. The material used for conductors 41 and 42 typically has a resistivity that is no greater than about four to five (4-5) micro ohm-cm. Elements 13 and 14 typically are formed overlying the first portion of substrate 37. A dielectric 38 typically is formed on a surface of substrate 37 in order to electrically insulate inductor 11 from substrate 37. Conductor 41 is formed on the surface of dielectric 38 in the desired pattern of element 14. For example, a mask may be applied to dielectric 38 and patterned to expose the portions of dielectric 38 where conductor 41 is to be formed. Alternatively, a layer of conductive material is deposited overlying dielectric layer 38, and subsequently patterned using conventional photolithographic and etch techniques to form conductor 41. Thereafter, dielectric 39 is formed overlying conductor 41. Dielectric 39 may not be formed on the portion of conductor 41 where node 16 is formed. Conductor 42 is formed on the surface of dielectric 39 that is overlying the top surface of conductor 41. Conductor 42 is also formed on the surface of conductor 41 where node 16 is formed. A dielectric 40 optionally is applied to cover conductor 42 to electrically insulate conductor 42 from other elements of device 10.

Inductor 12 is formed in a manner similar to inductor 11. Element 22 includes a conductor similar to conductor 41 and an overlying dielectric similar to dielectric 39. Element 21 includes a conductor similar to conductor 42 and overlying dielectric similar to dielectric 40. Node 23 is formed in a manner similar to node 16.

Figure 5:
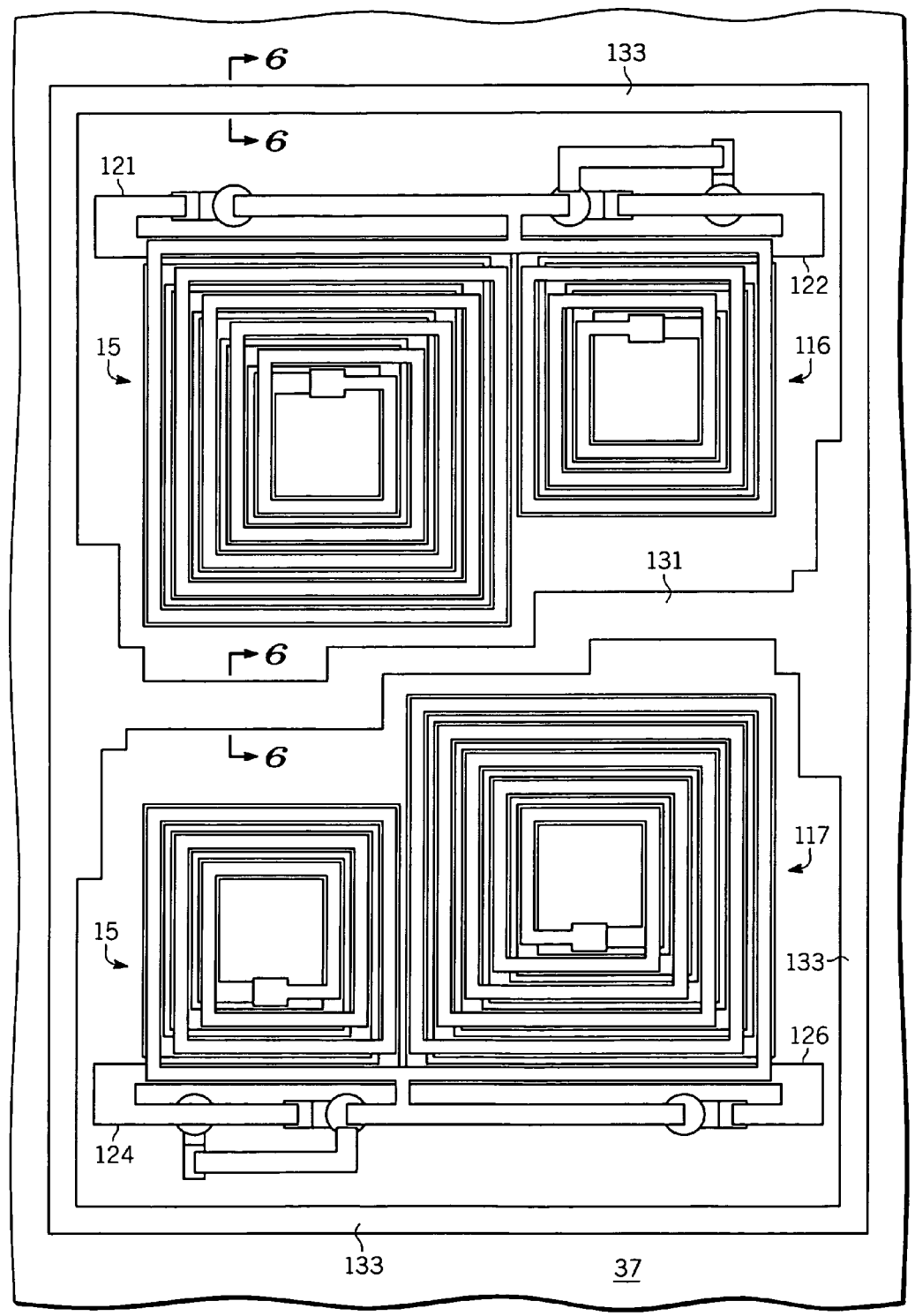
FIG. 5 illustrates a plan view of an embodiment of a filter structure in accordance with an embodiment of the present invention.

FIG. 5 shows a plan view of a filter structure 115 having a first filter device 116 and a second filter device 117 formed at least partially within or as part of a semiconductor substrate or region 37. By way of example, semiconductor substrate 37 comprises a <100> p-type conductivity substrate having a dopant concentration on the order of about $1.0 \times 10^9$ atoms/$cm^3$. In one embodiment, substrate 37 comprises silicon. Alternatively, substrate 37 comprises other semiconductor materials such IV-IV or III-V materials. Additionally, it is understood that the term semiconductor substrate means a region of semiconductor material, and this can include a semiconductor wafer, a region of semiconductor material formed within a semiconductor wafer, a layer of semiconductor material formed overlying a semiconductor wafer, or a layer of semiconductor material formed overlying an insulative layer or insulative material.

First filter device 116 provides a first channel of filter structure 115, and second filter device 117 provides a second channel of filter structure 115. It is understood that filter structure 115 may have many such filter devices integrated therein to provide a multiple channel filter device, and that two channels are shown to illustrate the present invention. In this embodiment and by way of example, first and second filter devices each comprise semiconductor filter devices 15 of FIG. 2 configured in accordance with the present invention. Filter device 116 includes an input pad 121 and an output pad 122, and filter device 117 includes an input pad 124 and an output pad 126.

In accordance with the present invention, filter structure 115 further includes a vertical ground plane structure, ground plane, ground side-wall, or ground stripe 131 that extends vertically above semiconductor substrate 37, and separates or isolates filter device 116 from filter device 117. In an alternative embodiment, filter structure 115 further includes a second vertical ground plane structure or ground ring 133 that surrounds both filter devices 116 and 117. In one embodiment, ground plane 131 is tied to or is electrically coupled to ground ring 133 as shown in FIG. 5. In another embodiment, ground plane 131 and/or ground ring 133 are tied to or are coupled to substrate 37, which is tied to ground for example, when in operation. In a further embodiment, ground plane 131 and/or ground ring 133 contact substrate 37 continuously along their entire lengths. In a still further embodiment, ground plane 131 and/or ground ring 133 are separated from semiconductor substrate 37 by an insulating layer, and are coupled to another bias voltage such as $V_{CC}$ when filter structure 115 is in operation. In accordance with the present invention, ground plane 131 and ground ring 133 are configured to reduce cross-coupling between first filter device 116 or one channel, and second filter device 117 or another channel when filter structure 115 is in operation.

Figure 6:
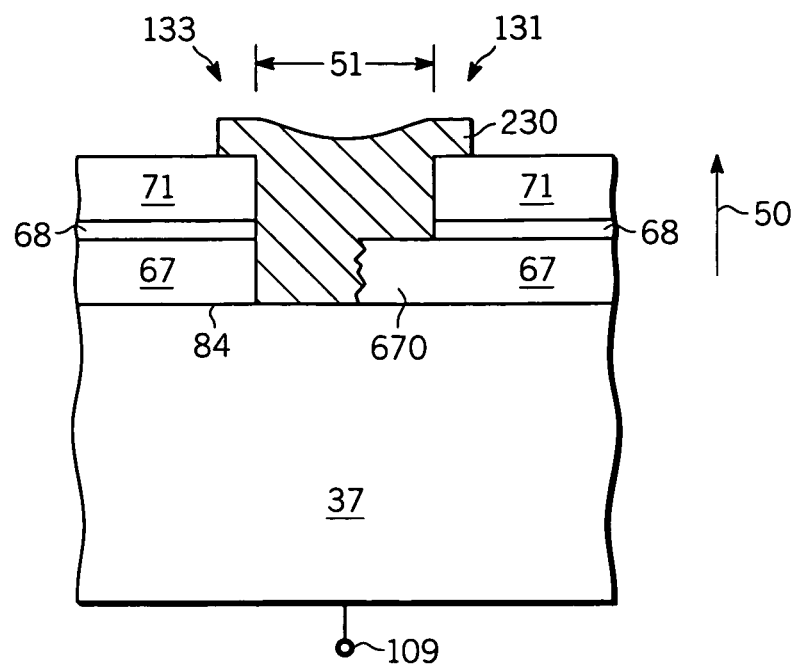
FIG. 6 illustrates a partial cross-sectional view of a portion of the structure of FIG. 5 taken along reference lines 6-6 in accordance with an embodiment of the present invention.

FIG. 6 shows a partial cross-sectional view of a portion of ground plane 131 and ground ring 133 taken along reference line 6-6 in FIG. 5 in accordance with an embodiment of the present invention. In this embodiment, ground plane 131 and/or ground ring 133 comprise a conductive contact 230 extending vertically above major surface 84 of semiconductor substrate 37 as illustrated generally by vertical arrow 50, which is generally perpendicular to major surface 84. An isolation or passivation layer 67 is formed overlying major surface 84, and comprises silicon dioxide, a deposited oxide, a nitride, a spin-on glass, combinations thereof, or the like. A passivating or capacitive layer 68 is formed overlying layer 67, and comprises for example, an oxide. The thickness of layer 68 is selected according to desired capacitive/voltage characteristics of components included in filter devices 116 and 117, which will be explained in further detail below.

A second passivation layer 71 is formed overlying major surface 84, and comprises for example, approximately 0.5 microns of a deposited oxide such as one formed using tetraethylorthosilicate (TEOS), or a deposited nitride. An opening 51 is then formed in a portion of layers 71, 68 and 67 above substrate 37 using conventional photolithographic and etching techniques. A conductive layer is then formed overlying major surface 84 and within opening 51, and subsequently patterned to form conductive contact 230 of vertical ground plane 131 and/or ground ring 131. By way of example, conductive contact 230 comprises about 1.5 microns to about 2.5 microns of aluminum or an aluminum alloy (e.g., AlSi). In one embodiment, conductive contact 230 is electrically coupled to or tied to semiconductor substrate 37, which is typically tied to ground terminal or common return 109. In an alternate embodiment, opening 51 extends only to passivation layer 67 as illustrated by portion 670 so that conductive contact 230 is isolated from substrate 37.

Figure 7:
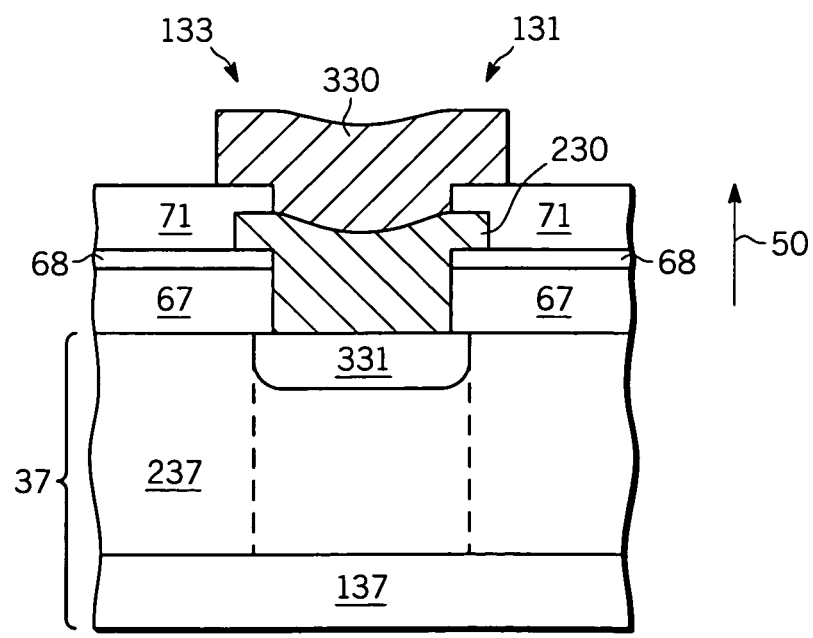
FIG. 7 illustrates a partial cross-sectional view of an alternative embodiment of the present invention.

FIG. 7 shows a partial cross-sectional view of alternative embodiments of ground plane 131 and/or ground ring 133. In this embodiment, ground plane 131 and/or ground ring 133 comprise a multiple layer structure including conductive contacts 230 and 330. Conductive contacts 230 and 330 extend vertically above major surface 84 of semiconductor substrate 37 as illustrated generally by vertical arrow 50, which is generally perpendicular to major surface 84.

FIG. 7 further shows an alternative embodiment of semiconductor substrate 37, which includes a semiconductor wafer 137 having a semiconductor layer 237 formed overlying a major surface of semiconductor wafer 137. By way of example, layer 237 comprises a lightly doped p-type region 237 formed overlying a more heavily doped p-type wafer 137, and is formed using conventional epitaxial growth techniques. An optional p-type highly doped region 331 is configured to improve the contact resistance between conductive contact 230 and lightly doped semiconductor layer 237 or enhance the ground connection for conductive contact 230. As noted by the dashed lines, doped region 331 terminates within semiconductor layer 237, or extends through semiconductor layer 237 to heavily doped region or substrate 137. By extending through semiconductor layer 237, doped region further provides an improved or enhanced ground connection to conductive contact 230 in accordance with the present invention. By way of example, conductive contact 330 comprises copper, aluminum, or an aluminum alloy. In an alternative embodiment, conductive contact 230 is isolated from semiconductor substrate 37 as illustrated in FIG. 6.

Figure 8:
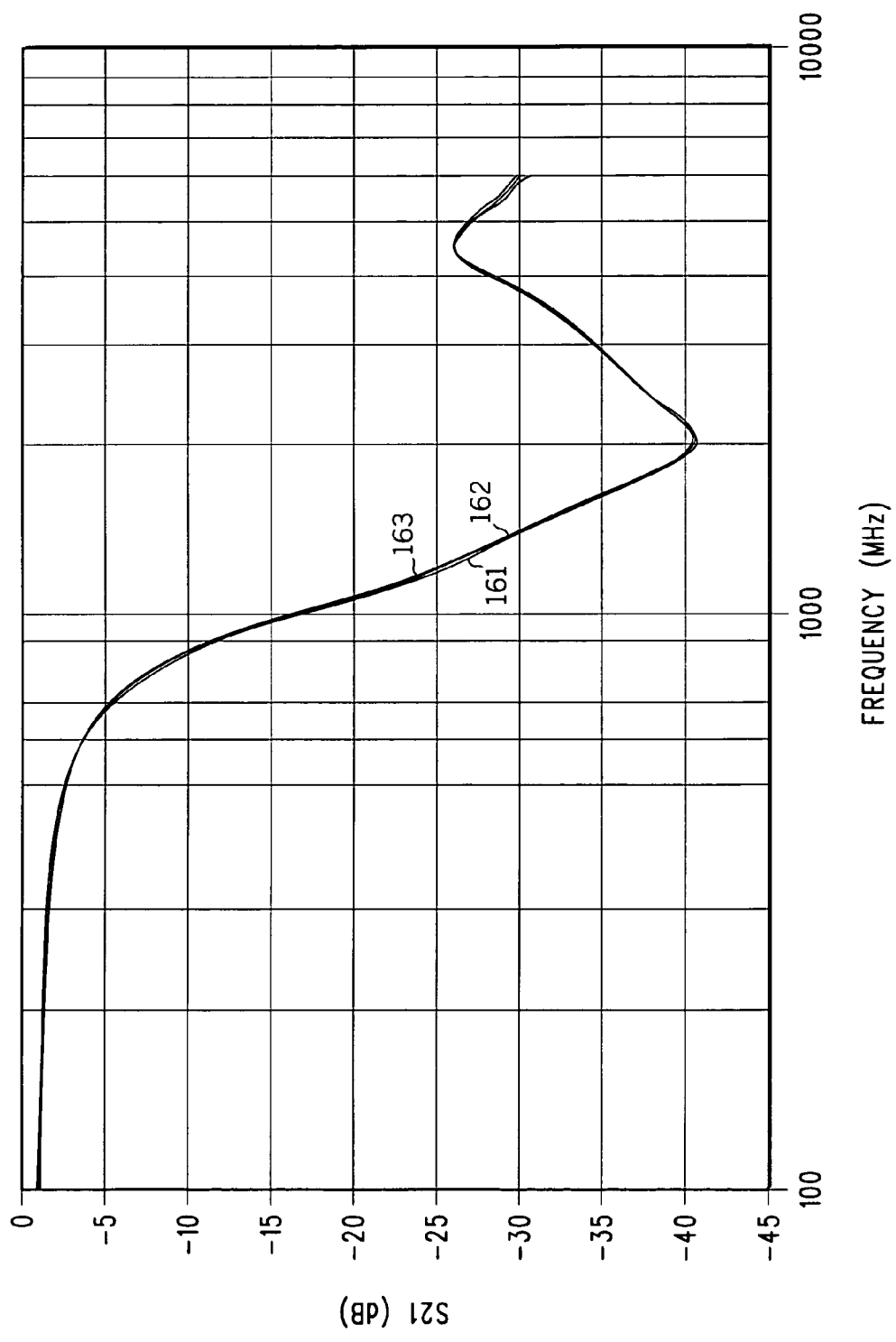
FIG. 8 illustrates a graph of insertion loss or in-channel, forward transmission characteristics of various embodiments of the present invention.

FIG. 8 shows a graph of insertion loss characteristics comparing various embodiments of filter structure 115 shown in FIG. 5. Line 161 represents a filter structure without any vertical ground plane, line 162 represents a filter structure with vertical ground plane 131, and line 163 represents a filter structure with vertical ground plane 131 and ground ring 133. As shown in FIG. 8, the presence of ground plane 131 or ground plane 131 and ground ring 133 causes essentially no change to the in-channel filtering characteristics of filter structure 115.

Figure 9:
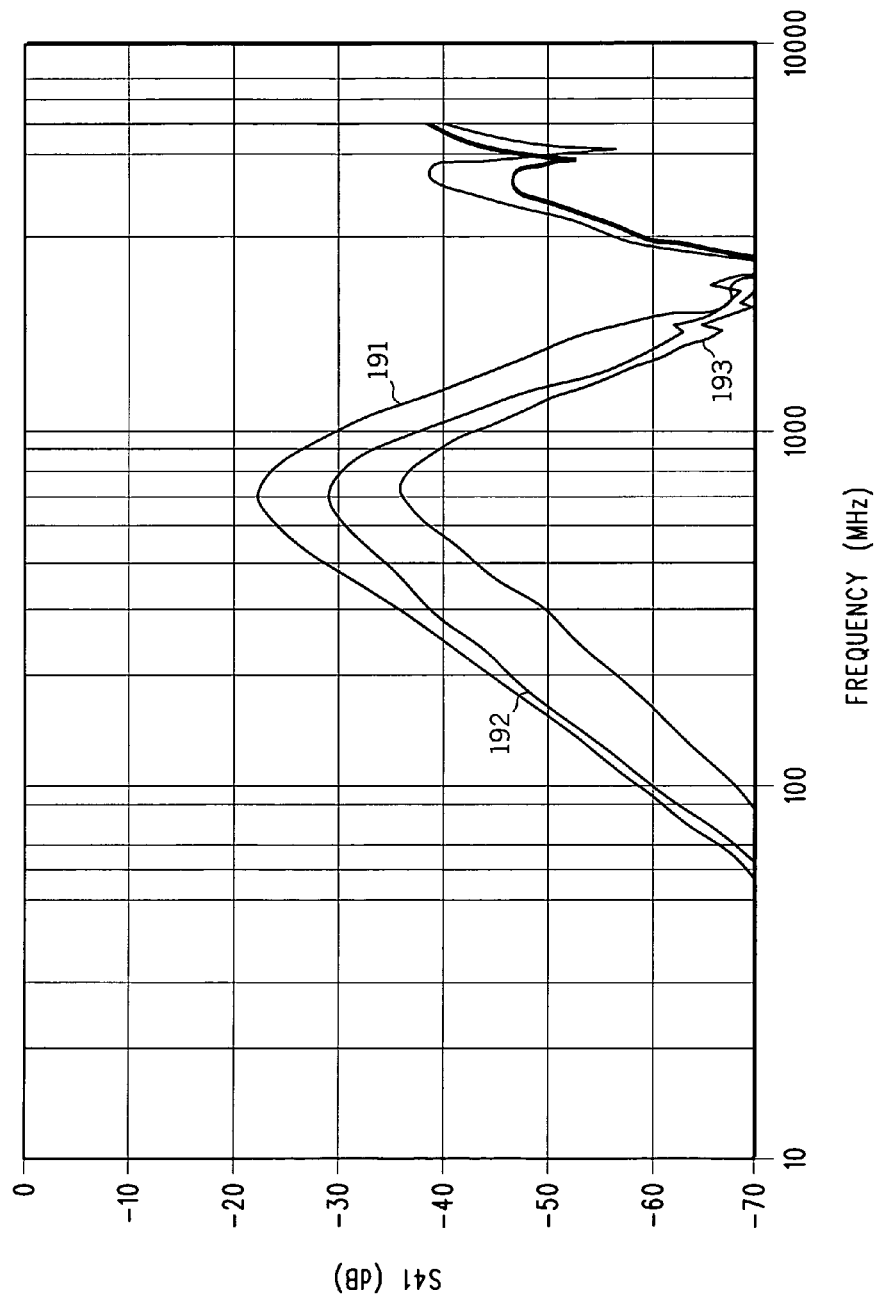
FIG. 9 illustrates a graph of analog cross-talk characteristics of various embodiments of the present invention.

FIG. 9 shows a graph of analog cross-talk characteristics comparing various embodiments of filter structure 115 shown in FIG. 5. Line 191 represents a filter structure without any vertical ground plane, line 192 represents a filter structure with vertical ground plane 131, and line 193 represents a filter structure with vertical ground plane 131 and ground ring 133. As shown in FIG. 9, the presence of ground plane 131 or ground plane 131 and ground ring 133 dramatically reduces the magnitude of the cross-channel transmission parameter S41, which is desired to be less than about −30 dB in the 400 MHz<f<900 MHz range.

Figure 10:
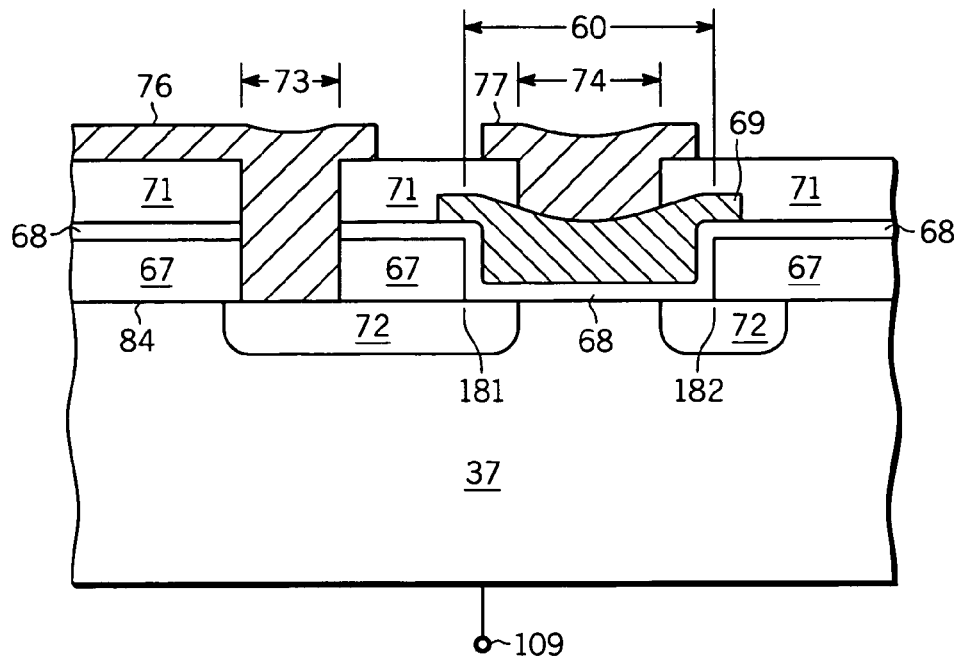

FIG. 10 shows a highly enlarged partial cross-sectional view of an integrated linear (i.e., voltage independent) floating capacitor or MOS capacitor structure or capacitor/TVS structure or device 81 suitable for use as device 43, 44, and/or 46 in structure 15 shown in FIG. 2. Device 81 is referred to as integrated because it is a single device that functions both as a capacitive element and a transient voltage suppression element. Device 81 is referred to as floating because both contacts of the capacitor (e.g., contacts 69 and 76 described below) are isolated from ground or common return terminal 109. This supports certain filter or circuit designs such as elliptic filters.

Device 81 is formed using or as part of semiconductor substrate or region 37. A well, split well, doped, or diffused region 72 is formed in region 37 and extends from major surface 84. In this embodiment, well region 72 has n-type conductivity and a dopant concentration on the order of about $1.0 \times 10^{20}$ atoms/cm$^3$. By way of example, ion implantation and photomasking techniques are used to form split well region 72. Alternatively, a hardmask process is used to form split well region 72. Isolation or passivation layer 67 is formed overlying major surface 84 and well region 72. Opening 60 is then formed in a portion of layer 67 above the split portion of well region 72, and capacitive layer 68 is formed in opening 60 and overlying layer 67, and comprises for example, an oxide. The thickness of layer 68 is selected according to desired capacitive/voltage characteristics of device 81. By way of example, layer 68 has a thickness from about 0.005 microns to about 0.05 microns when layer 68 comprises a silicon oxide. It is understood that layer 68 may comprise other materials such as silicon nitride, tantalum pentoxide, barium strontium titanate, titanium dioxide or combinations thereof including combinations with silicon oxide or the like.

A first contact or conductive layer 69 is formed overlying layer 68 to provide one plate of the MOS capacitor and split well region 72 provides the other plate. By way of example, first contact 69 comprises a doped polycrystalline semiconductor material (e.g., doped polysilicon), or another conductive material, and may include a silicide layer or comprises several different materials formed in a layered structure. In one embodiment, first contact 69 comprises about 0.4 microns to about 0.8 microns of polysilicon doped with a high dose phosphorous implant (e.g., $1.0 \times 10^{15}$ atoms/cm$^2$ to about $1.0 \times 10^{16}$ atoms/cm$^2$). Next, second passivation layer 71 is formed overlying major surface 84.

Openings 73 and 74 are then formed using conventional photoresist and etch techniques with opening 73 overlying a portion of well region 72, and opening 74 overlying first contact 69. A conductive layer is then formed overlying major surface 84 and within openings 73 and 74, and patterned to formed contacts 76 and 77. By way of example, contacts 76 and 77 comprise aluminum, an aluminum alloy, or another conductive material. In one embodiment, contacts 76 and 77 comprise about 2.0 microns of an aluminum/silicon alloy, and are formed at the same time as conductive contact 230 (shown in FIG. 6) of ground plane 131 and/or ground ring 133.

Device 81 has a split well region 72 that is not continuous underneath layer 68. That is, capacitive layer 68 adjoins or contacts both substrate 37 and well region 72 to form a MOS-gated diode device. Also, split well region 72 forms both a plate of the capacitor element and an electrode or junction of the TVS element. The term split well region means a doped well region where a portion of the doped well region is separated or discontinuous so that a portion of substrate 37 is exposed within, surrounded by, bounded on one side, bounded on all sides, or encircled at major surface 84 by the well region.

The concentration of substrate region 37 is selected so that the threshold voltage $V_T$ of the MOS capacitor is low and preferably even negative, such that the capacitance characteristic is substantially constant within a desired operating voltage range (for example, from 0 to +5 volts). Well region 72 overlaps both edges 181 and 182 of MOS gate 69, which better supports a desired condition of $V_{GS} > V_T$. In an alternative embodiment, well region 72 overlaps only edge 181 of MOS gate 69.

In another embodiment, well region 72 is formed using a high dose phosphorous ion implant to provide a peak concentration of about $3.0 \times 10^{19}$ atoms/cm$^3$ followed by a high dose arsenic ion implant to provide a peak concentration of about $5.0 \times 10^{19}$ atoms/cm$^3$. In an alternative embodiment, the order of the ion implants is reversed. The chain implant provides a net peak doping on the order of about $8.0 \times 10^{19}$ atoms/cm$^3$. This chain implant was found to reduce the series resistance of well region 72 by up to 90%, which enhances for example, the RF characteristics of the structure.

In device 81, the MOS capacitor formed by contact 69, layer 68, and a portion of well region 72 provides the floating capacitive element (e.g., capacitors 17, 18, and/or 19 of FIG. 1) for devices 43, 44, and/or 46, and the pn junction formed between well region 72 and substrate 37 provides the TVS element (e.g., diodes 337, 338, and/or 339 of FIG. 1) for devices 43, 44, and/or 46. Because device 81 is integrated, it has for example, lower resistance and a smaller on-chip "footprint" compared to the non-integrated devices of the prior art.

Figure 11:
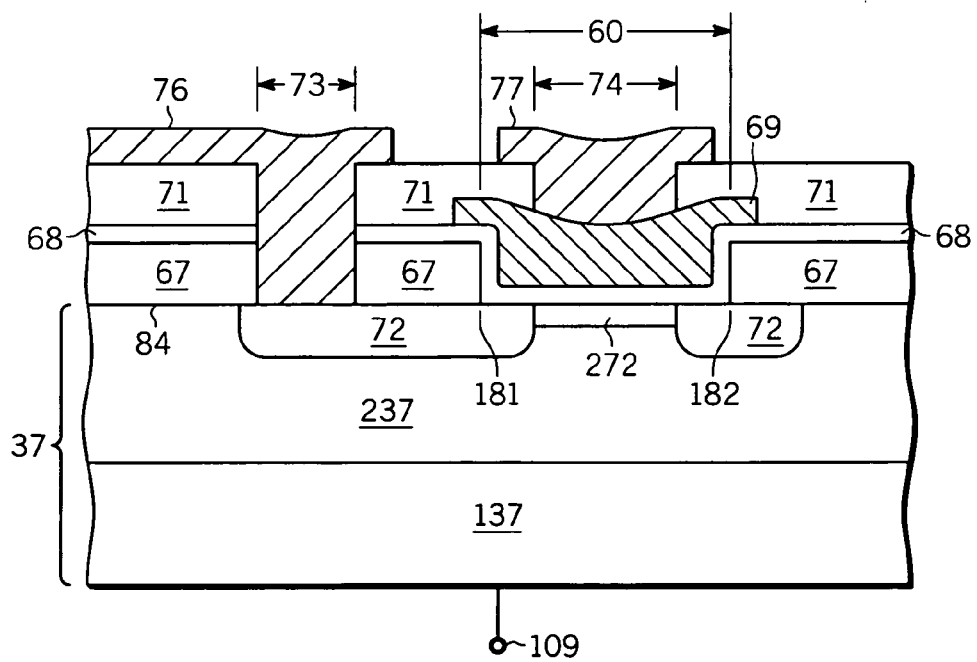

FIG. 11 shows a highly enlarged partial cross-sectional view of an integrated linear (i.e., voltage independent) floating capacitor or MOS capacitor structure or capacitor/TVS structure or device 91 suitable for use as device 43, 44, and/or 46 in structure 15. Device 91 is similar to device 81 except region 37 comprises lightly doped p-type region 237 formed overlying more heavily doped p-type substrate 137 as described in conjunction with FIG. 7.

In certain applications, for example where a MOSFET device is incorporated with an integrated MOS capacitor of the present invention, certain design challenges exist when highly doped region 37 is used by itself as in device 81. For example, in order to form well region 72 in region 37, well region 72 must be about five to ten times more heavily doped than region 37. Also, the heavy doping in substrate region 37 produces threshold voltages that are unacceptably high in magnitude. Additionally, the heavy doping can impact the mobility of carriers in the channel region of the MOSFET device. Moreover, when well region 72 is formed directly in highly doped region 37 as in device 81, the pn junction formed between these regions may have higher than desired leakage current and higher than desired capacitance per unit area. In device 91, a lower capacitance and lower leakage pn junction is provided for use in those applications where these characteristics are desired.

In device 91, the junction between well region 72 to lightly doped region 237 behaves more like a one-sided junction where junction capacitance is dominated by the doping concentration and thickness of region 237. One constraint on the doping concentration and thickness of region 237 is that these variables are selected to support a desired breakdown voltage and ESD characteristic for the TVS device. The authors of the present invention found that device 91 in accordance with the present invention lowers specific capacitance by a factor of about 5-10×. This allows for a more precise tuning of the diode and floating MOS capacitor capacitances in a decoupled and independent manner, which adds degrees of freedom for design purposes.

In order to reduce the ground resistance, substrate 137 therefore is highly doped. By way of example, substrate 137 comprises a <100> p-type conductivity substrate having a dopant concentration on the order of about $1.0 \times 10^{19}$ atoms/cm$^3$. In one embodiment, substrate 137 comprises silicon. Alternatively, substrate 137 comprises other semiconductor materials such IV-IV or III-V materials. Layer 237 comprises for example, a p-type layer formed using for example, epitaxial growth techniques, and has a dopant concentration less than that of substrate 137. In one embodiment, layer 237 has a dopant concentration on the order of about $1.0 \times 10^{15}$ atoms/cm$^3$ to about $1.0 \times 10^{16}$ atoms/cm$^3$, and has a thickness on the order of about four microns to about ten microns. The doping concentration and thickness of layer 237 varies in accordance with known principles according to desired breakdown voltage and ESD requirements One additional feature of layer 237 is that it provides for a lightly doped n-type region 272 to be formed in major surface 84 below capacitive layer 68. Region 272 is optional and conveniently provides for controlling $V_T$ to a desired negative voltage. In one embodiment, region 272 comprises a phosphorous or arsenic doped region with a peak dopant concentration on the order of about $1.0 \times 10^{16}$ atoms/cm$^3$, which results in a negative value of $V_T$. This in turn ensures substantially constant capacitance over the operating voltage range (as an example, from 0 to +5 volts).

Figure 12:
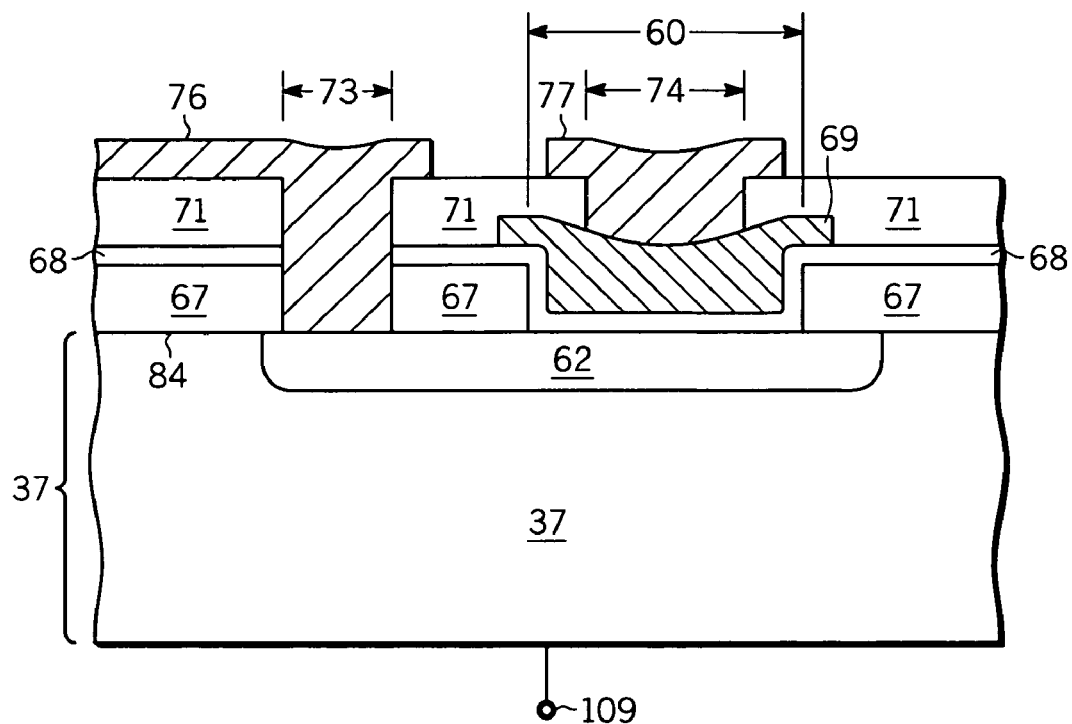

FIG. 12 shows a highly enlarged partial cross-sectional view of an integrated linear (i.e., voltage independent) floating capacitor or MOS capacitor structure or capacitor/TVS structure or device 101 suitable for use as device 43, 44, and/or 46 in structure 15. Device 101 is similar to device 81 except device 101 has an n-type well region 62 that is not split, but is continuous under the MOS capacitor structure as shown in FIG. 12.

In device 101, the MOS capacitor formed by contact 69, layer 68, and well region 62 provides the floating capacitive element (e.g., capacitors 17, 18, and/or 19 of FIG. 1) for devices 43, 44, and/or 46, and the pn junction formed between well region 62 and substrate 37 provides the TVS element (e.g., diodes 337, 338, and/or 339 of FIG. 1) for devices 43, 44, and/or 46.

In another embodiment of device 101, region 37 is comprised of a heavily doped substrate region over which is grown a lightly doped epitaxial region. This accomplishes a drop in junction capacitance similar to the drop in capacitance described in section 0035 above.

Figure 13:
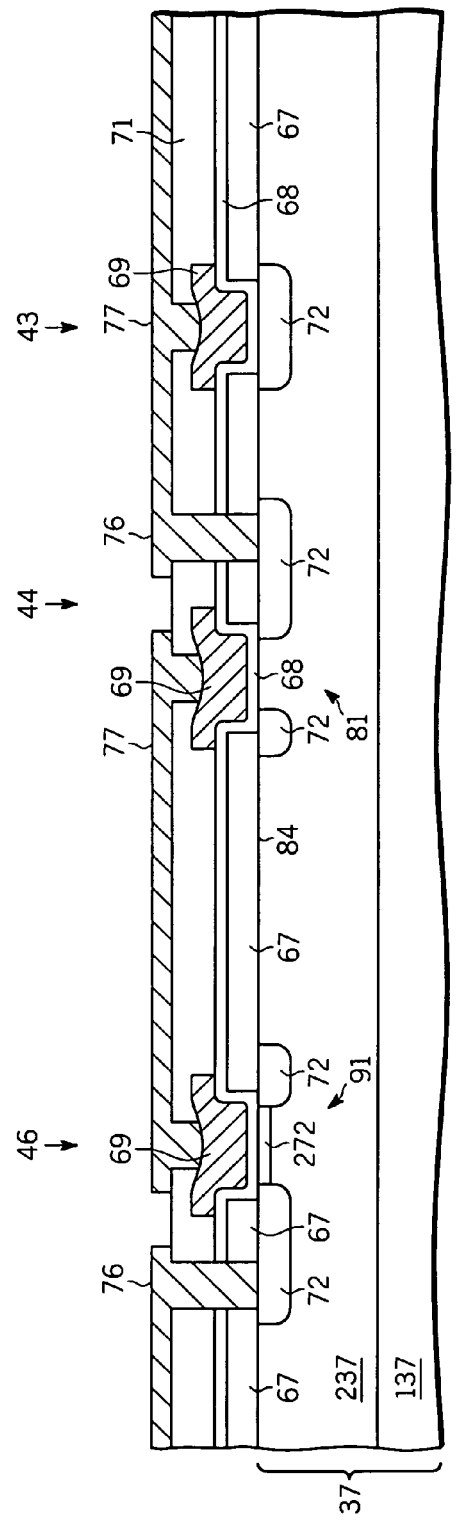
FIGS. 10-13 illustrate partial cross-sectional views of various embodiments of device structures for use with the present invention.

FIG. 13 shows a highly enlarged partial cross-sectional view of structure 15 of FIG. 2 taken along reference line 13-13. In this partial cross-section, devices 46, 44 and 43 are shown in the implementation of structure 15 of FIG. 2 as integrated devices 91 of FIG. 11 with device 46 including doped region 272. It is understood that devices 44 and 43 may also include doped regions 272. In the alternative, devices 46, 44 and 43 comprise device 81 of FIG. 10 or device 101 of FIG. 12 or combinations thereof.

In view of all the above, it is evident that an integrated filter structure having multiple channels and a ground plane device and a method of manufacture have been provided. The structure and method reduce cross-coupling problems between multiple channels, which allows the multiple channels to be integrated into a smaller space.

Although the invention has been described and illustrated with reference to specific embodiments thereof, it is not intended that the invention be limited to these illustrative embodiments. Those skilled in the art will recognize that modifications and variations can be made without departing from the spirit of the invention. For example, a MIM capacitor is used instead of a MOS capacitor in another filter embodiment. Therefore, it is intended that this invention encompass all such variations and modifications as fall within the scope of the appended claims.

We claim:

1. A filter structure comprising:
   a first filter device formed at least partially within a first conductivity type semiconductor substrate having a first major surface, wherein the first filter device provides a first channel of the filter structure;
   a second filter device formed at least partially within the semiconductor substrate and spaced apart from the first filter device; wherein the second filter device provides a second channel of the filter structure; and
   a first ground plane structure formed overlying the semiconductor substrate, wherein at least a portion of the first ground plane structure electrically contacts the semiconductor substrate, and wherein the first ground plane structure extends vertically above the semiconductor substrate, and is configured to reduce cross-channel coupling between the first and second channels when the filter structure is in operation.

2. The filter structure of claim 1 wherein the first ground plane structure is formed between the first and second filter devices, and wherein the filter structure further comprises a second ground plane structure surrounding the first and second filter devices, and wherein the second ground plane structure extends vertically above the semiconductor substrate to form a ground ring.

3. The filter structure of claim 2 wherein the first and second ground plane structures are electrically coupled together.

4. The filter structure of claim 2, wherein the at least a portion of the second ground plane structure electrically contacts the semiconductor substrate.

5. The filter structure of claim 1 wherein the first ground plane structure electrically contacts the semiconductor substrate along the first ground plane structure's entire length.

6. The filter structure of claim 1 wherein the first ground plane structure comprises at least two layers of metal.

7. The filter structure of claim 6 wherein one of the two layers comprises copper and the other layer comprises a different metal.

8. The filter structure of claim 1, wherein the first filter device comprises:
   a first doped region of a second conductivity type opposite the first conductivity formed in the semiconductor substrate and extending from the first major surface, wherein the first doped region and the semiconductor substrate form a pn junction that provides both a first capacitance element for the filter structure and a transient voltage suppression element for the filter structure, and wherein the first capacitance element is other than a parasitic element;
   a first conductive layer contacting a first portion of the first doped region;
   a dielectric layer formed overlying a second portion of the first doped region, wherein the first doped region is continuous adjacent the dielectric layer; and
   a second conductive layer formed overlying the dielectric layer, wherein the second conductive layer, the dielectric layer, and the first doped region form a second capacitive element for the filter structure, and wherein the first doped region has a dopant concentration that provides a substantially constant capacitance/voltage characteristic when a selected voltage range is applied between the second conductive layer and the first doped region.

9. The filter structure of claim 1, wherein the semiconductor substrate has a first dopant concentration and a semiconductor layer of the first conductivity type formed overlying the semiconductor substrate, and wherein the semiconductor layer has a second dopant concentration less than the first dopant concentration, and wherein the first filter device comprises:
   a first floating capacitor device formed adjacent the first major surface; and
   a first transient voltage suppression device formed adjacent the first major surface, wherein the first floating capacitor device and the first transient voltage suppression device share a first doped region of a second conductivity type formed in the semiconductor layer, and wherein the first doped region terminates at the first major surface so that the first floating capacitor device overlies a portion of the semiconductor layer and a portion of the first doped region.

10. The filter structure of claim 8, wherein the first filter device further comprises an inductor.

11. The filter structure of claim 10 wherein the inductor comprises a first multilayer inductor overlying at least a portion of the semiconductor substrate, the first multilayer inductor having a first terminal and a second terminal, the first multilayer inductor also having a first conductor overlying the portion of the semiconductor substrate, a second conductor overlying at least a portion of the first conductor, a first dielectric disposed between the first conductor and the second conductor.

12. The filter structure of claim 1, wherein the semiconductor substrate has a first dopant concentration and a semiconductor layer of the first conductivity type formed overlying the semiconductor substrate, wherein the semiconductor layer has a second dopant concentration less than the first dopant concentration.

13. The filter structure of claim 12 further comprising a doped region of the first conductivity type formed in the semiconductor layer and having a higher dopant concentration than the semiconductor layer, wherein the doped region is further configured for improving contact between the first ground plane structure and the semiconductor substrate.

14. A filter structure including:
a semiconductor substrate of a first conductivity type having a first major surface;
a first filter device formed as part of the semiconductor substrate, the first filter device configured to provide a first channel of the filter structure and having first input and a first output;
a second filter devise formed as part of the semiconductor substrate, the second filter device configured to provide a second channel of the filter structure and having a second input and a second output; and
a first ground plane structure extending in a generally vertical direction from and above the first major surface and configured to reduce cross-channel coupling between the first and second channels when the filter structure is in operation, wherein the first ground plane structure laterally separates the first and second filter devices, and wherein at least a portion of the first ground plane structure is in contact with the semiconductor substrate.

15. The structure of claim 14, wherein the first ground plane structure comprises at least two conductive layers.

16. The structure of claim 15 further comprising a second ground plane structure comprising a ground ring that surrounds both the first and second filter devices, and wherein the second ground plane structure extends in a generally vertical direction from and above the first major surface.

17. The structure of claim 16, wherein at least a portion of the second ground plane structure contacts the semiconductor substrate.

18. The structure of claim 16, wherein the second ground plane structure is isolated from the semiconductor substrate.

19. A filter structure comprising:
a semiconductor substrate having a first dopant concentration;
a semiconductor layer having a first conductivity type and a first major surface formed in spaced relationship with the semiconductor substrate, wherein the semiconductor layer has a second dopant concentration less than the first dopant concentration
a first filter device formed at least partially within the semiconductor layer, wherein the first filter device provides a first channel of the filter structure, and wherein the first filter device includes:
a first floating capacitor device formed adjacent the first major surface; and
a first transient voltage suppression device formed adjacent the first major surface wherein the first floating capacitor device and the first transient voltage suppression device share a first doped region of a second conductivity type opposite the first conductivity type formed in the semiconductor layer, and wherein the first doped region terminates at the first major surface so that the first floating capacitor device overlies a portion of the semiconductor layer and a portion of the first doped region;
a second filter device formed at least partially within the semiconductor layer and spaced apart from the first filter device; wherein the second filter device provides a second channel of the filter structure; and
a first ground plane structure formed overlying the semiconductor layer, wherein at least a portion of the first ground plane structure electrically contacts the semiconductor substrate, and wherein the first ground plane structure extends vertically above the semiconductor substrate, and is configured to reduce cross-channel coupling between the first and second channels when the filter structure is in operation.

* * * * *

UNITED STATES PATENT AND TRADEMARK OFFICE
CERTIFICATE OF CORRECTION

PATENT NO. : 7,579,670 B2
APPLICATION NO. : 11/482238
DATED : August 25, 2009
INVENTOR(S) : Shastri et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 467 days.

Signed and Sealed this

Fourteenth Day of September, 2010

David J. Kappos
*Director of the United States Patent and Trademark Office*